United States Patent [19]
Tanaka et al.

[11] Patent Number: 5,109,260
[45] Date of Patent: * Apr. 28, 1992

[54] SILICON THIN FILM TRANSISTOR AND METHOD FOR PRODUCING THE SAME

[75] Inventors: Sakae Tanaka; Yoshiaki Watanabe, both of Tokyo; Katsuo Shirai; Yoshihisa Ogiwara, both of Tochigi, all of Japan

[73] Assignees: Seikosha Co., Ltd., Tokyo; Nippon Precision Circuits Ltd., Tochigi, both of Japan

[*] Notice: The portion of the term of this patent subsequent to Jun. 4, 2008 has been disclaimed.

[21] Appl. No.: 564,815

[22] Filed: Aug. 8, 1990

Related U.S. Application Data

[62] Division of Ser. No. 377,873, Jul. 10, 1989.

[51] Int. Cl.$^5$ .................... H01L 27/01; H01L 27/13; H01L 29/78
[52] U.S. Cl. .................................... 357/23.7; 357/4
[58] Field of Search ............... 357/23.1, 23.7, 2, 4

[56] References Cited

FOREIGN PATENT DOCUMENTS 61-32471  2/1986  Japan .................................... 357/23.7
62-30375  2/1987  Japan .................................... 357/237

Primary Examiner—Jerome Jackson, Jr.
Assistant Examiner—D. Monin
Attorney, Agent, or Firm—Jordan and Hamburg

[57] ABSTRACT

A silicon thin film transistor array includes a plurality of silicon thin film transistors in an array-like form, each silicon thin film transistor including an insulating substrate, a gate electrode formed on the insulating substrate, a gate insulating layer formed on the insulating substrate containing the gate electrode, a pair of first impurity contained silicon layers formed on the gate insulating layer in such a manner as to transversely cross a terminal part of the gate electrode, an intrinsic silicon layer formed on the pair of first impurity contained silicon layers and on the gate insulating layer between the pair of first impurity contained silicon layers in such a manner as to connect the pair of first impurity contained silicon layers, a protective insulation layer formed on the intrinsic silicon layer, and a source electrode and a drain electrode formed at contact parts of the pair of first impurity contained silicon layers; gate wiring for connecting the gate electrodes of the silicon thin film transistors to each other; and source wiring for connecting the source electrodes of the silicon thin film transistors to each other.

1 Claim, 16 Drawing Sheets

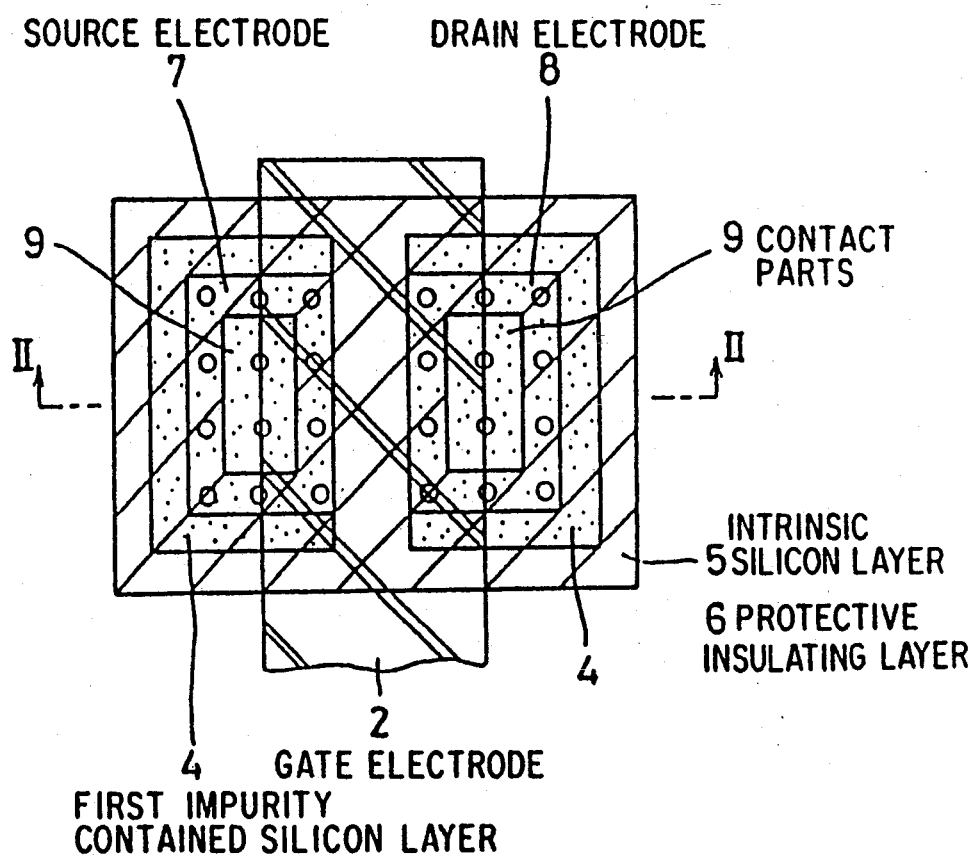

FIG. 12(a)
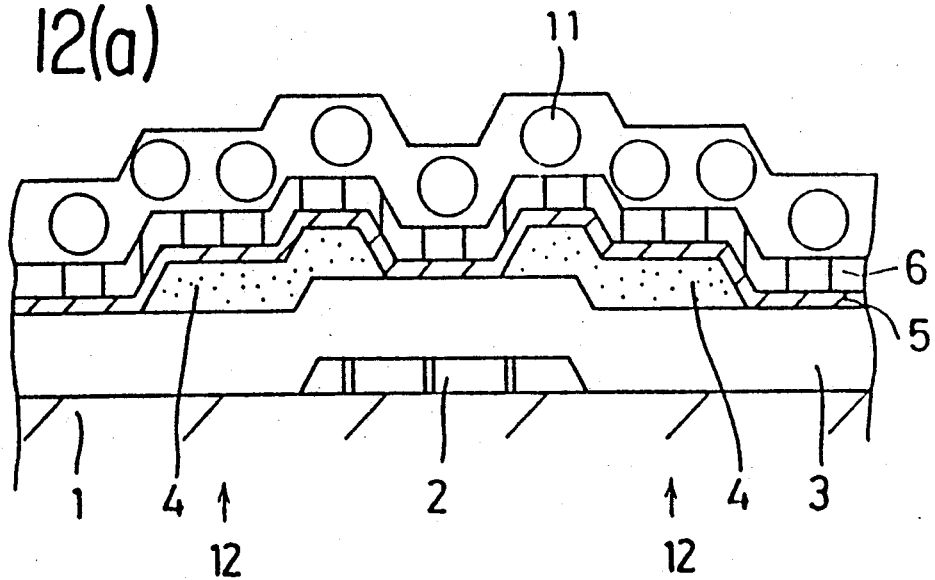
FIG. 12(b)
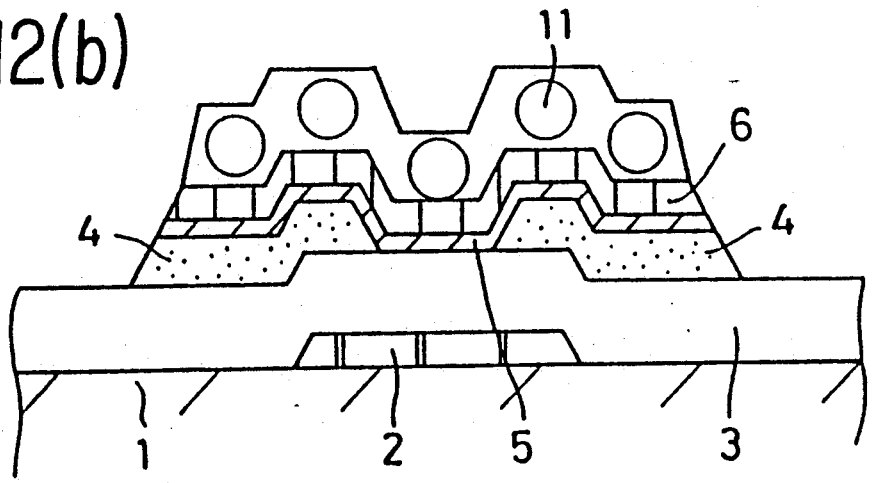
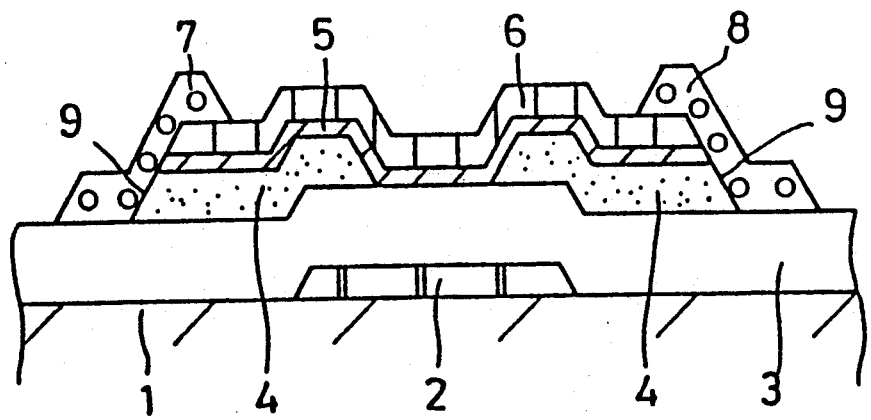
FIG. 12(c)

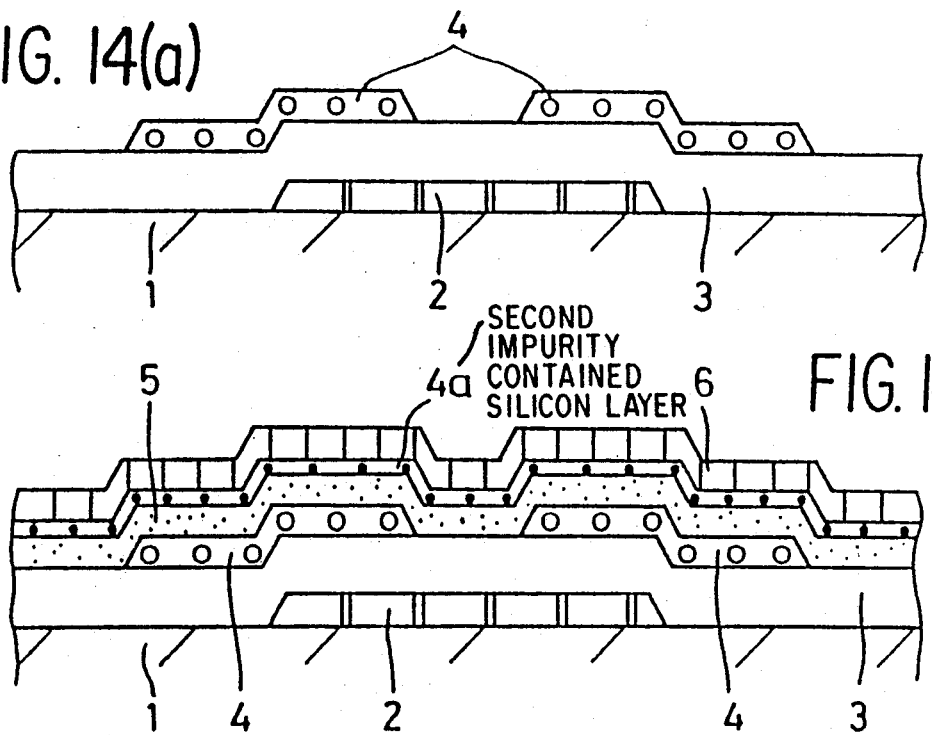
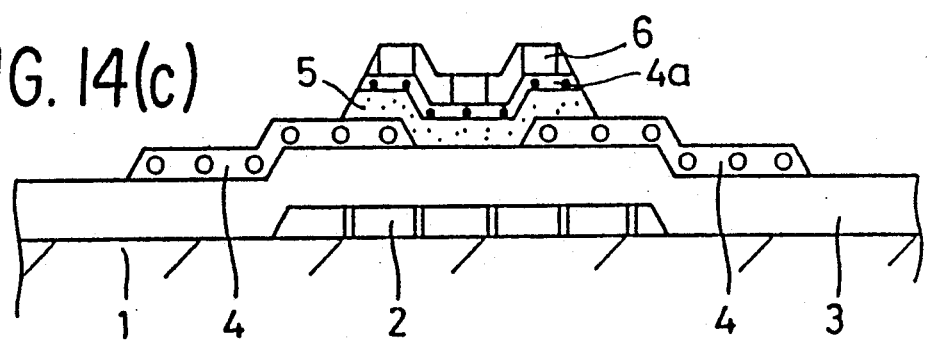
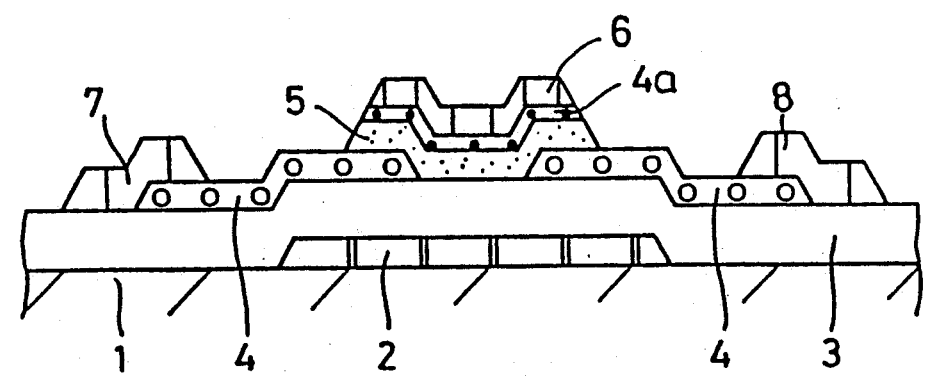

SILICON THIN FILM TRANSISTOR AND METHOD FOR PRODUCING THE SAME

This is a division of application Ser. No. 377,873, filed Jul. 10, 1989.

BACKGROUND OF THE INVENTION

The present invention relates to a silicon thin film transistor utilized in an active matrix type liquid crystal display device and a method for producing the same.

Referring initially to FIG. 26, there is shown an example of a conventional silicon thin film transistor which includes an insulating substrate 21, a gate electrode 22 thereon, a gate insulating layer 23 on substrate 21 and electrode 22, an impurity contained silicon layer 24 containing a suitable amount of impurities which become a donor or an acceptor, an intrinsic silicon layer 25 disposed between gate insulating layer 23 and silicon layer 24 and which becomes an active layer, a protective insulating layer 26, a source electrode 27 and a drain electrode 28.

As shown in the same Figure, such a silicon thin film transistor in which intrinsic silicon layer 25 and protective insulating layer 26 have been continuously formed, has excellent reliability, reproducibility of characteristics, and the like, and research and development thereof is widely carried out thereon.

In the above-described conventional silicon thin film transistor, protective insulating layer 26 formed by use of silicon nitride, silicon oxide, or the like is removed to expose intrinsic silicon layer 25, and an impurity contained silicon layer 24 is formed on this exposed intrinsic silicon layer 25.

However, at the protective insulating layer side of intrinsic silicon layer 25, there is a layer in which nitrogen, oxygen, or the like contained in protective insulating layer 26 has diffused. When protective insulating layer 26 is removed, this layer in which nitrogen, oxygen, or the like has been diffused is not completely removed. Accordingly, the junction of the intrinsic silicon layer and the impurity contained silicon layer becomes insufficient, resulting in deterioration of the transistor characteristics.

The present invention solves the above-described problems by improving the junction state of the intrinsic silicon layer and the impurity contained silicon layer to provide a silicon thin film transistor having good transistor characteristics, and a method for producing the same.

BRIEF DESCRIPTION OF THE DRAWINGS

FIG. 1 is a plan diagram showing a first embodiment of the present invention;

FIGS. 12(a)-12(c) are cross-sectional diagrams showing the production procedure for forming a seventh embodiment of the present invention;

FIGS. 14(a)-14(d) are cross-sectional diagrams showing the production procedure for forming a ninth embodiment of the present invention;

DESCRIPTION OF THE PREFERRED EMBODIMENTS

Figure 2A:
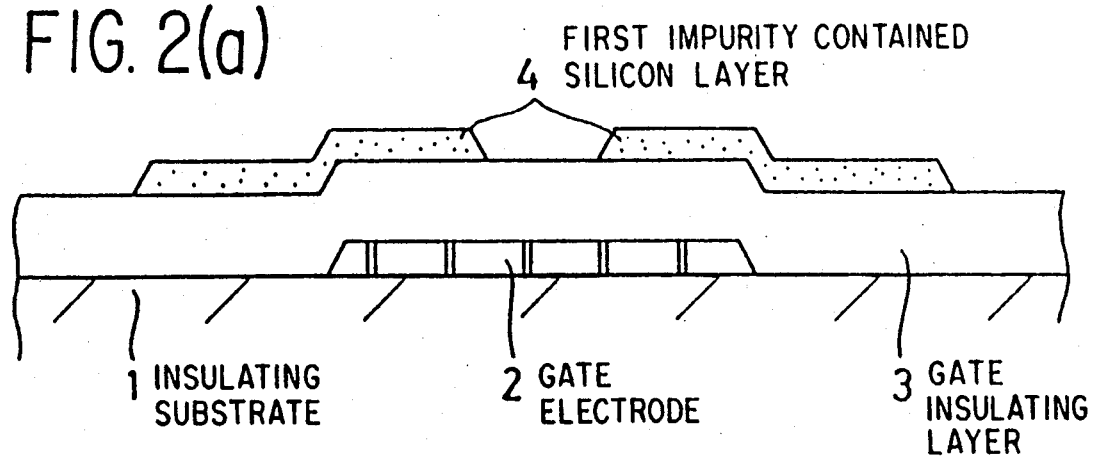
FIGS. 2(a)-2(c) are cross-sectional diagrams taken along line II—II of FIG. 1, showing the production procedure of the first embodiment of FIG. 1.

In the following description, embodiments of the present invention will be explained with reference to the drawings.

Embodiment 1

Referring to FIGS. 1 and 2, an insulating substrate 1 using glass or the like is provided, and a gate electrode 2 formed of Cr (chromium) is formed thereon. A gate insulating layer 3 formed of silicon nitride or silicon oxide is formed on substrate 1 and gate electrode 2, with a first impurity contained silicon layer 4 formed of amorphous silicon containing a suitable amount of impurities which become a donor or an acceptor formed thereon. An intrinsic silicon layer 5 formed of amorphous silicon which becomes an active layer is formed on insulating layer 3 and silicon layer 4, with a protective insulating layer 6 formed of silicon nitride or silicon oxide being deposited thereon. A source electrode 7 and a drain electrode 8 formed of ITO (indium tin oxide) are also provided, and a contact part 9 of first impurity contained silicon layer 4 connects first impurity contained silicon layer 4 to source electrode 7 and drain electrode 8.

An explanation will now be given of the production method by referring to FIGS. 2(a) to 2(c).

As shown in FIG. 2(a), gate electrode 2 is formed on insulating substrate 1, gate insulating layer 3 is formed on insulating substrate 1 containing gate electrode 2, and first impurity contained silicon layer 4 is formed on gate insulating layer 3. The pattern of the pair of first impurity contained silicon layers is formed by etching layer 4 in such a manner as to transversely cross the terminal part of gate electrode 2.

Figure 2B:
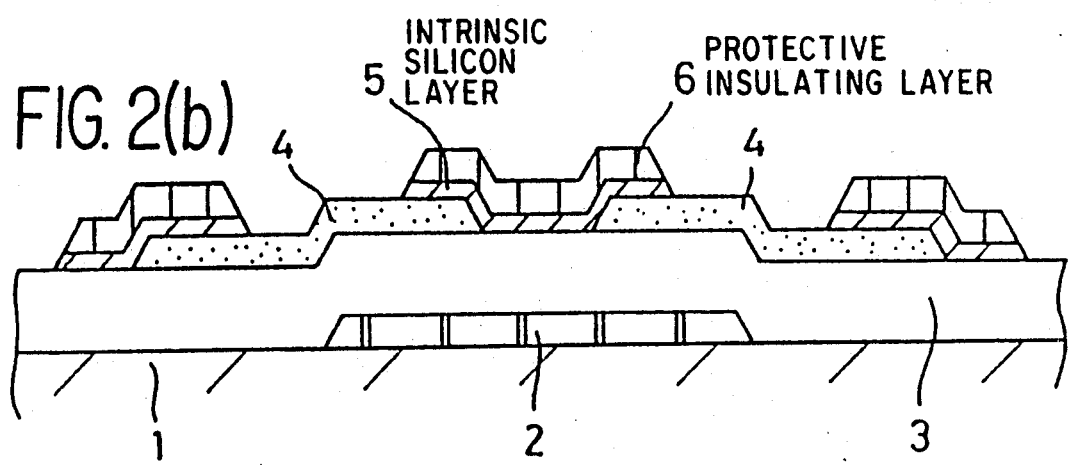

As shown in FIG. 2(b), intrinsic silicon layer 5 and protective insulating layer 6 are continuously formed. Specifically, by use of a photoresist as a mask, protective insulating layer 6 is etched by using a buffered fluoric acid solution. Intrinsic silicon layer 5 is etched by use of a dry etching method using a CF gas to expose first impurity contained silicon layer 4, and after cleaning the surface of exposed first impurity contained silicon layer 4 with a diluted fluoric acid aqueous solution, the photoresist is peeled off. In such a manner as described above, intrinsic silicon layer 5 and protective insulating layer 6 are of the same shape and are formed on gate insulating layer 3 and on the pair of first impurity contained layers 4.

Figure 2C:
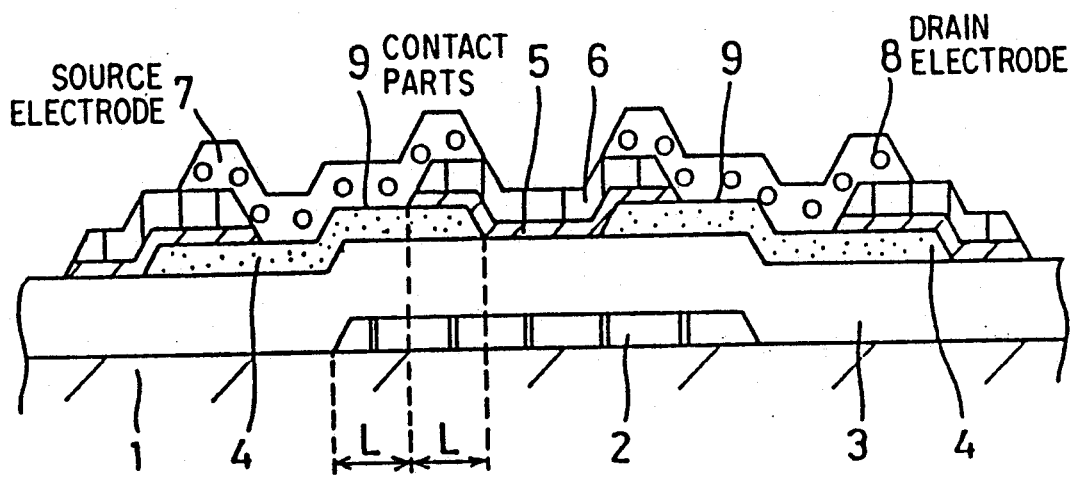

As shown in FIG. 2(c), source electrode 7 and drain electrode 8 are formed in such a manner as to contact the contact part 9 of exposed first impurity contained silicon layer 4.

By means of the above-described procedures, the silicon thin film transistor shown in FIG. 2(c) is obtained.

In the present embodiment, since intrinsic silicon layer 5 is formed on first impurity contained silicon layer 4, and protective insulating layer 6 is formed on intrinsic silicon layer 5, the junction state of first impurity contained silicon layer 4 to intrinsic silicon layer 5 is improved, and good transistor characteristics can be obtained.

Also, although first impurity contained silicon layer 4 and intrinsic silicon layer 5 are discontinuously formed in both the prior art and the present invention, it has been experimentally proven that in the case of using an amorphous silicon layer on first impurity contained silicon layer 4 and intrinsic silicon layer a better junction can be obtained by forming intrinsic silicon layer 5 on first impurity contained silicon layer 4 than by forming first impurity contained silicon layer 4 on intrinsic silicon layer 5. Therefore, the present invention is better than the prior art.

Embodiment 2

Figure 3:
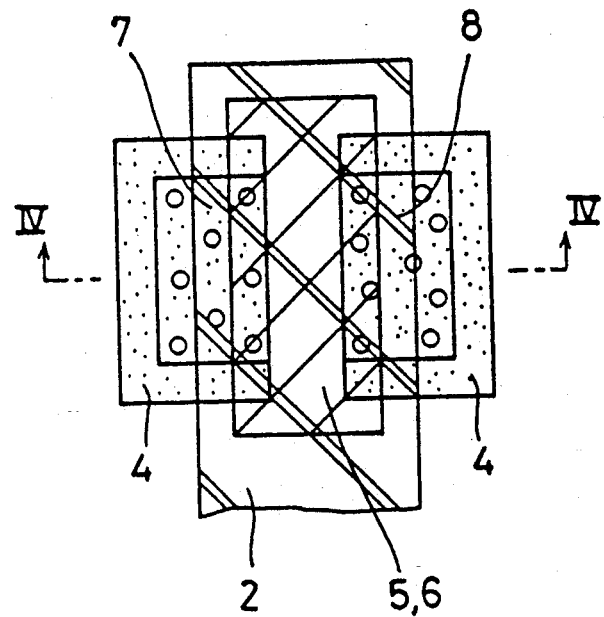
FIG. 3 is a plan diagram showing a second embodiment of the present invention.
Figure 4:
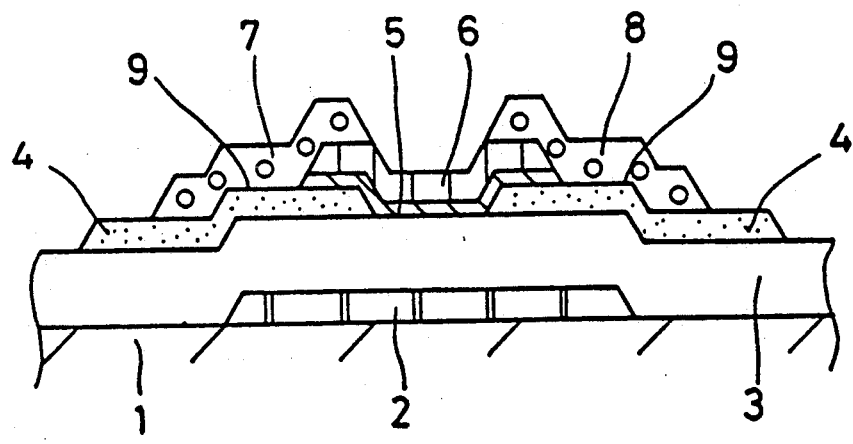
FIG. 4 is a cross-sectional diagram taken along line IV—IV of FIG. 3.

Referring now to FIGS. 3 and 4, there is shown a second embodiment of the present invention.

The present embodiment provides an arrangement in which intrinsic silicon layer 5 is formed within the boundary defined by gate electrode 2.

In such a silicon thin film transistor, and particularly in which amorphous silicon is used in intrinsic silicon layer 5, the off-current is increased when light is irradiated on intrinsic silicon layer 5.

In the present embodiment, since intrinsic silicon layer 5 has been formed within the boundary of gate electrode 2, light from the side of insulating substrate 1 is completely shut off and such light does not reach intrinsic silicon layer 5. Therefore, the increase of current due to light irradiation can be reduced to a large extent.

It is noted that the present embodiment can only be realized by changing the mask pattern in contrast to the case of the first embodiment.

Embodiment 3

Figure 5:
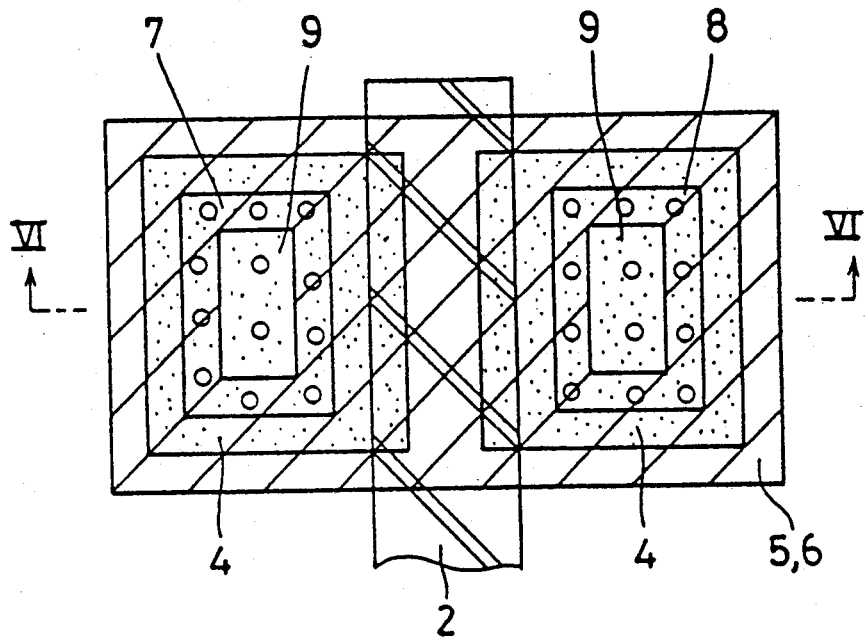
FIG. 5 is a plan diagram showing a third embodiment of the present invention.
Figure 6:
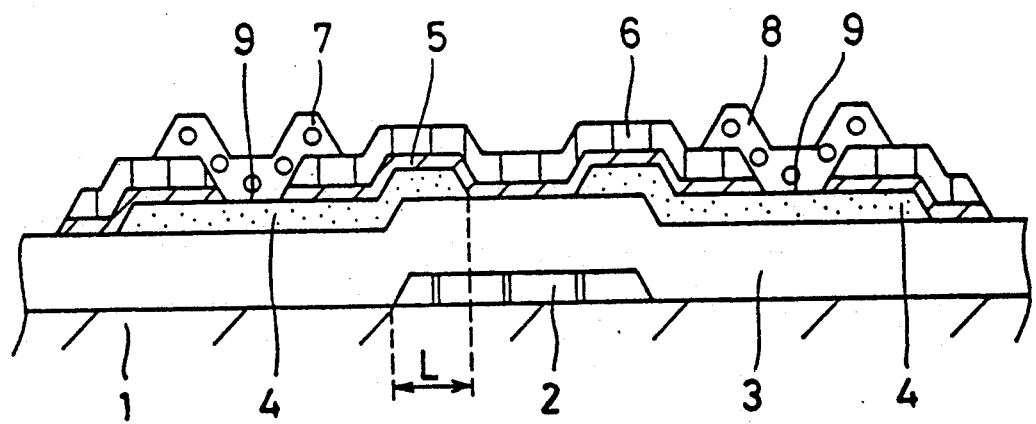
FIG. 6 is a cross-sectional diagram taken along line VI—VI of FIG. 5.

Referring now to FIGS. 5 and 6, there is shown a third embodiment of the present invention.

In this embodiment, a contact part 9 is formed outside of the boundary defined by gate electrode 2.

In the first embodiment, as shown in FIG. 2(c), since contact part 9 is formed in overlapping relation to the terminal part of gate electrode 2, the overlapped width of gate electrode 2 and first impurity contained silicon layer 4 is 2L. However, the design rule is that the width should be equal to L. On the other hand, in the present embodiment, as shown in FIG. 6, the overlap width becomes L. As is well known, the increase of the overlap capacity due to such overlap retards the response speed.

Therefore, according to the present embodiment, since the overlap width is half of that of the first embodiment, an improvement of the response speed of the transistor can be devised.

It is noted that the present embodiment can be realized only by changing the mask pattern.

Embodiment 4

Figure 7:
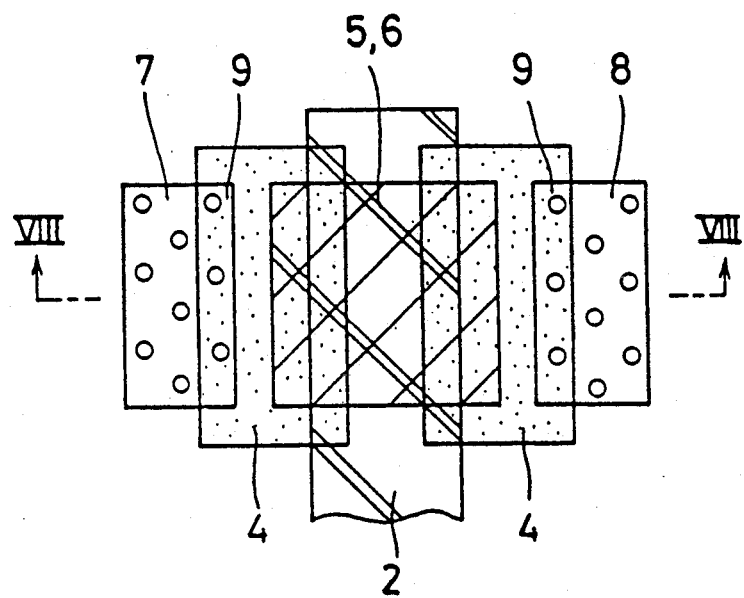
FIG. 7 is a plan diagram showing a fourth embodiment of the present invention.
Figure 8:
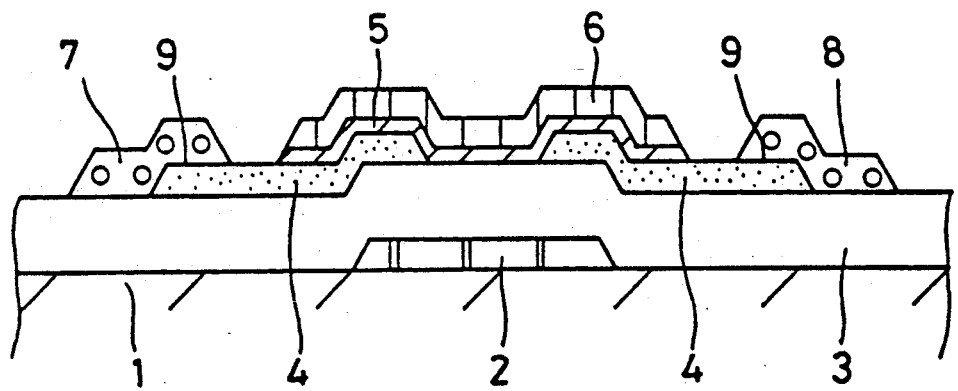
FIG. 8 is a cross-sectional diagram taken along line VIII—VIII of FIG. 7.

Referring now to FIGS. 7 and 8, there is shown a fourth embodiment of the present invention.

In the present embodiment, the terminal part of intrinsic silicon layer 5 is positioned outside of the boundary defined by gate electrode 2 and within the boundary defined by first impurity contained silicon layer 4.

In the present embodiment, since light from the side of insulating substrate 1 which reaches the terminal part of intrinsic silicon layer 5 formed of the boundary defined by gate electrode 2, can be reduced to a large extent over the whole range of such terminal part of intrinsic silicon layer 5 by first impurity contained silicon layer 4, the off-current of the transistor at the time of light irradiation can be decreased to a large extent.

The present embodiment can be realized only by changing the mask pattern.

Embodiment 5

Figure 9:
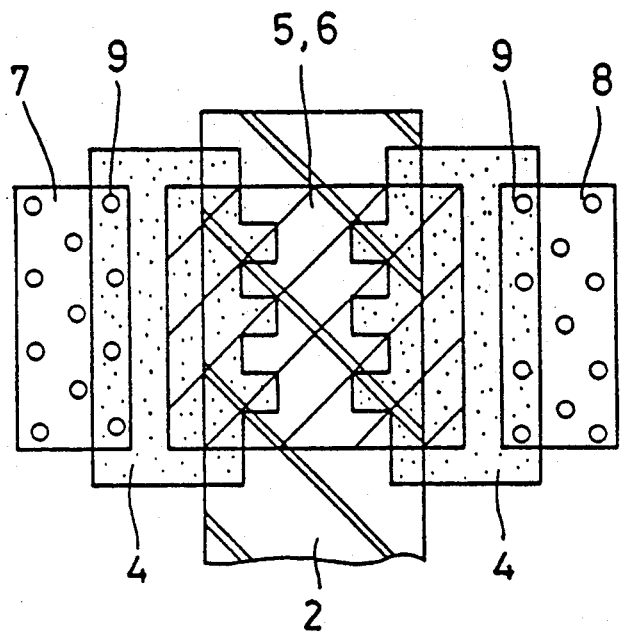
FIGS. 9 and 10 are plan diagrams showing a fifth embodiment of the present invention.
Figure 10:
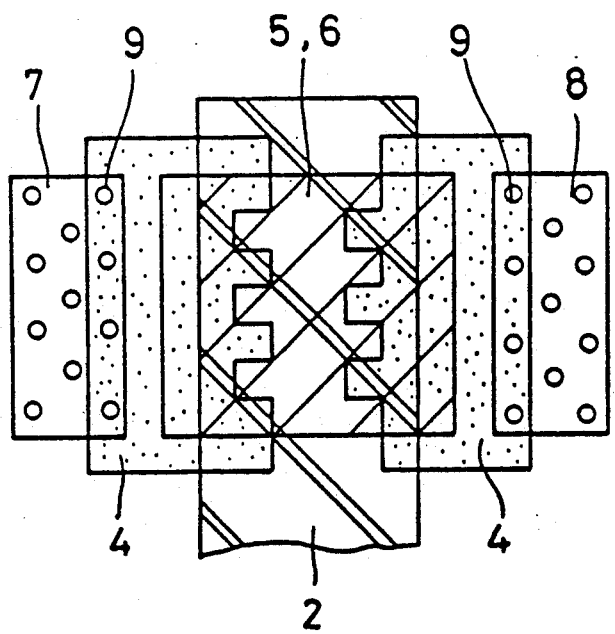

Referring now to FIGS. 9 and 10, there is shown a fifth embodiment of the present invention.

In the present embodiment, the counterposing edges of the pair of first impurity contained silicon layers 4 under intrinsic silicon layer 5 are formed in a comb teeth shape. Since first impurity contained silicon layer 4 and intrinsic silicon layer 5 are formed discontinuously, a sufficiently good junction might not be obtained, even if the junction state is improved in comparison with that of the prior art. When the junction is insufficient, parasite resistance occurs in the junction part, and the on-current of the transistor is lowered.

In the present embodiment, since the counterposed edges of the pair of first impurity contained silicon layers 4 are formed in uneven shapes, the parasite resistance of the junction part is decreased, and lowering of the on-current of the transistor can be prevented.

FIG. 9 shows the embodiment in which the teeth of opposing first impurity contained silicon layers 4 are in direct opposing relation, that is, in which a convex part of one first impurity contained silicon layer 4 is counterposed to a convex part of the other first impurity contained silicon layer 4, and a concave part of the one first impurity contained silicon layer is counterposed to a concave part of the other first impurity contained silicon layer 4. FIG. 10 shows the embodiment in which a concave part of one first impurity contained silicon layer 4 is counterposed to a convex part of the other first impurity contained silicon layer 4, that is, in which the teeth of opposing first impurity contained silicon layers 4 are offset from each other.

The present example can be realized only by changing the mask pattern in contrast to the above-described embodiments.

Embodiment 6

Referring now to FIG. 11, there is shown a sixth embodiment of the present invention.

An explanation of the production method will be given by referring to FIGS. 11(a) to 11(c).

Figure 11A:
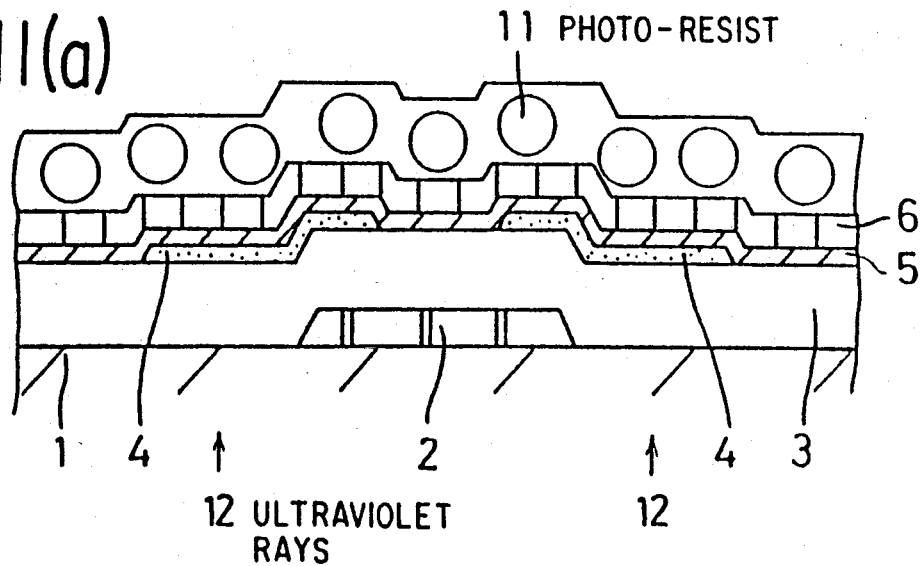
FIGS. 11(a)-11(c) are cross-sectional diagrams showing the production procedure for forming a sixth embodiment of the present invention.

As shown in FIG. 11(a), gate electrode 2 having light shielding properties is formed on insulating substrate 1 having a light transparency property, and gate insulating layer 3 is formed on insulating substrate 1 containing gate electrode 2. First impurity contained silicon layer 4 is formed on gate insulating layer 3, and by etching first impurity contained silicon layer 4, the pattern of a pair of first impurity contained silicon layers 4 is formed in such a manner as to transversely cross the terminal part of gate electrode 2.

Intrinsic silicon layer 5 and protective insulating layer 6 are formed in succession on gate insulating layer 3 and first impurity contained silicon layer 4, and a photoresist 11 is coated on protective insulating layer 6. Ultraviolet rays 12 are then irradiated from the back surface of insulating substrate 1 to expose photoresist 11 by use of gate electrode 2 as a mask.

Figure 11B:
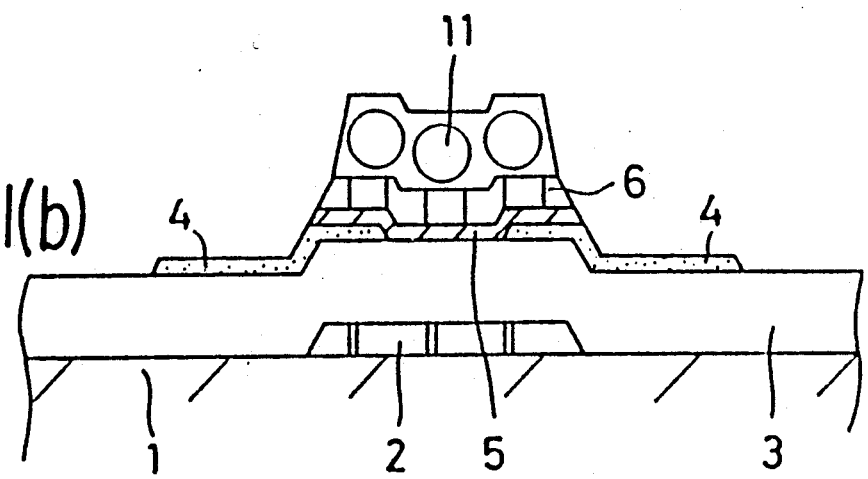

As shown in FIG. 11(b), photoresist 11, which is coordinated to gate electrode 2, is formed by developing the exposed photoresist 11, and protective insulating layer 6 and intrinsic silicon layer 5 are then etched by using this photoresist 11 as a mask to form intrinsic silicon layer 5 and protective insulating layer 6 coordinated to gate electrode 2 and connecting the pair of impurity contained silicon layers 4.

Figure 11C:
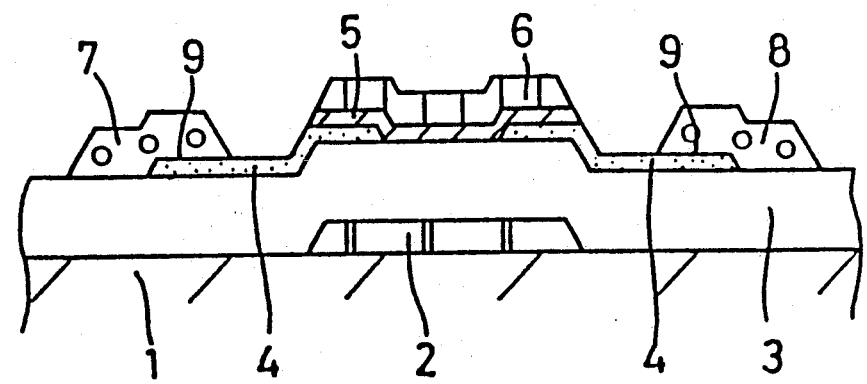

As shown in FIG. 11(c), photoresist 11 is then peeled off and source electrode 7 and drain electrode 8 are formed in such a manner as to contact the contact parts of the pair of first impurity contained silicon layers 4.

In the silicon thin film transistor produced by the procedures described above, since the pattern of intrinsic silicon layer 5 and protective insulating layer 6 is formed by utilizing the pattern of gate electrode 2, the number of photomasks can be reduced for one sheet in comparison with that in the case of the first embodiment.

Since first impurity contained silicon layer 4 absorbs ultraviolet rays 12, it is preferable in the present embodiment to make the film thickness of first impurity contained silicon layer 4 as thin as possible.

Embodiment 7

Referring now to FIG. 12, there is shown a seventh embodiment of the present invention.

An explanation will now be given of the production method by referring to FIGS. 12(a) to 12(c).

As shown in FIG. 12(a), gate electrode 2 having light shielding properties is formed on insulating substrate 1 having a light transparency property, and gate insulating layer 3 is formed on insulating substrate 1 containing gate electrode 2. First impurity contained silicon layer 4 is formed on gate insulating layer 3, and first impurity contained silicon layer 4 is then etched to form the pattern of a pair of first impurity contained silicon layers 4 in such a manner as to transversely cross the terminal part of gate electrode 2.

Intrinsic silicon layer 5 and protective insulating layer 6 are formed in succession on gate insulating layer 3 and first impurity contained silicon layer 4, and photoresist 11 is coated on protective insulating layer 6. Ultraviolet rays are then irradiated from the back surface of insulating substrate 1 to expose photoresist 11 by using gate electrode 2 and first impurity contained silicon layer 4 as masks.

As shown in FIG. 12(b), by developing photoresist 11, photoresist 11, which is coordinated to gate electrode 2 and first impurity contained silicon layer 4, is formed. Protective insulating layer 6 and intrinsic silicon layer 5 are then etched by use of this photoresist 11 as a mask to form intrinsic silicon layer 5 and protective insulating layer 6 coordinated to gate electrode 2 and first impurity contained silicon layer 4, and connecting the pair of first impurity contained silicon layers 4.

As shown in FIG. 12(c), photoresist 11 is then peeled off, and source electrode 7 and drain electrode 8 are formed in such a manner that they contact the contact part 9 of the terminal part of the pair of first impurity contained silicon layers 4.

In the silicon thin film transistor produced in the above-described procedure, since the pattern of intrinsic silicon layer 5 and protective insulating layer 6 is formed by utilizing the pattern of gate electrode 2 and first impurity contained silicon layer 4, the number of photomasks can be reduced to one sheet for the first embodiment.

Since it is required that ultraviolet rays are sufficiently absorbed by first impurity contained silicon layer 4, it is preferable in the present embodiment to make the film thickness of first impurity contained silicon layer 4 as thick as possible.

Embodiment 8

Figure 13:
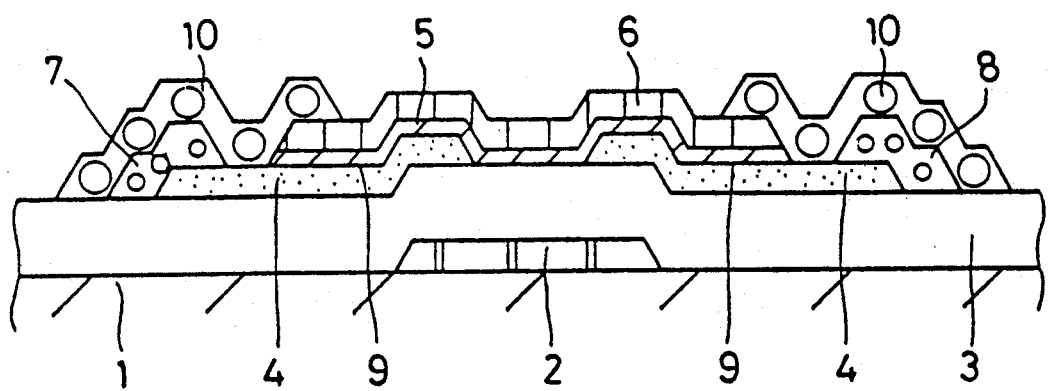
FIG. 13 is a cross-sectional diagram showing an eighth embodiment of the present invention.

Referring now to FIG. 13, there is shown an eighth embodiment of the present invention. In the present embodiment, an auxiliary electrode 10 is formed in such a manner as to contact first impurity contained silicon layers 4 and to cover the step difference part of source electrode 7 and drain electrode 8 at the terminal part of first impurity contained layer 4.

According to the present embodiment, even if source electrode 7 or drain electrode 8 is broken at the step difference part, electrical connection can be obtained with auxiliary electrode 10.

For auxiliary electrode 10, it is satisfactory that Ti (titanium) or the like is used.

Embodiment 9

Referring now to FIG. 14, there is shown a ninth embodiment of the present invention. In FIG. 14, there are provided insulating substrate 1, gate electrode 2 using Cr (chromium), gate insulating layer 3 using silicon nitride, first impurity contained silicon layer 4 containing n-type impurities such as phosphorous or the like in amorphous silicon, intrinsic silicon layer 5, which becomes an active layer using amorphous silicon, a second impurity contained silicon layer 4a on intrinsic silicon layer 5 and containing impurities of the type reverse to the impurities in first impurity contained silicon layer 4, that is, impurities of the p-type such as boron or the like, protective insulating layer 6 thereover and using silicon nitride or the like, and source electrode 7 and drain electrode 8 using ITO (indium tin oxide) or a metal.

An explanation will now be given of the production method by referring to FIGS. 14(a) to 14(d).

As shown in FIG. 14(a), gate electrode 2 is formed on insulating substrate 1, gate insulating layer 3 is formed on insulating substrate 1, on which gate electrode 2 is formed, and on gate insulating layer 3, there is formed the pair of first impurity contained silicon layers 4 in such a manner that they overlap gate electrode 2.

As shown in FIG. 14(b), intrinsic silicon layer 5, second impurity contained silicon layer 4a, and protective insulating layer 6 are continuously formed. For forming second impurity contained silicon layer 4a, a plasma CVD method, optical CVD method, ion implanting method using boron or the like, electrical discharge method by use of a discharge of a gas such as $B_2H_6$ or the like can be used.

As shown in FIG. 14(c), by successively etching protective insulating layer 6, second impurity contained silicon layer 4a, and intrinsic silicon layer 5 by use of the same mask, these three layers are formed in a pattern of the same shape. In this case, pattern formation is carried out such that intrinsic silicon layer 5 connects the pair of first impurity contained silicon layers 4.

As shown in FIG. 14(d), source electrode 7 and drain electrode 8 to be connected to the pair of impurity contained silicon layers 4 are then formed.

In the present embodiment, since intrinsic silicon layer 5 and second impurity contained silicon layer 4a are continuously formed, the junction interface of these two layers is extremely clean.

Further, since second impurity contained silicon layer 4a and protective insulating layer 6 are also formed continuously, a clean interface can be obtained.

It is noted that first impurity contained silicon layer 4 may be made as a p-type, and second impurity contained silicon layer 4a as an n-type.

Embodiment 10

Figure 15:
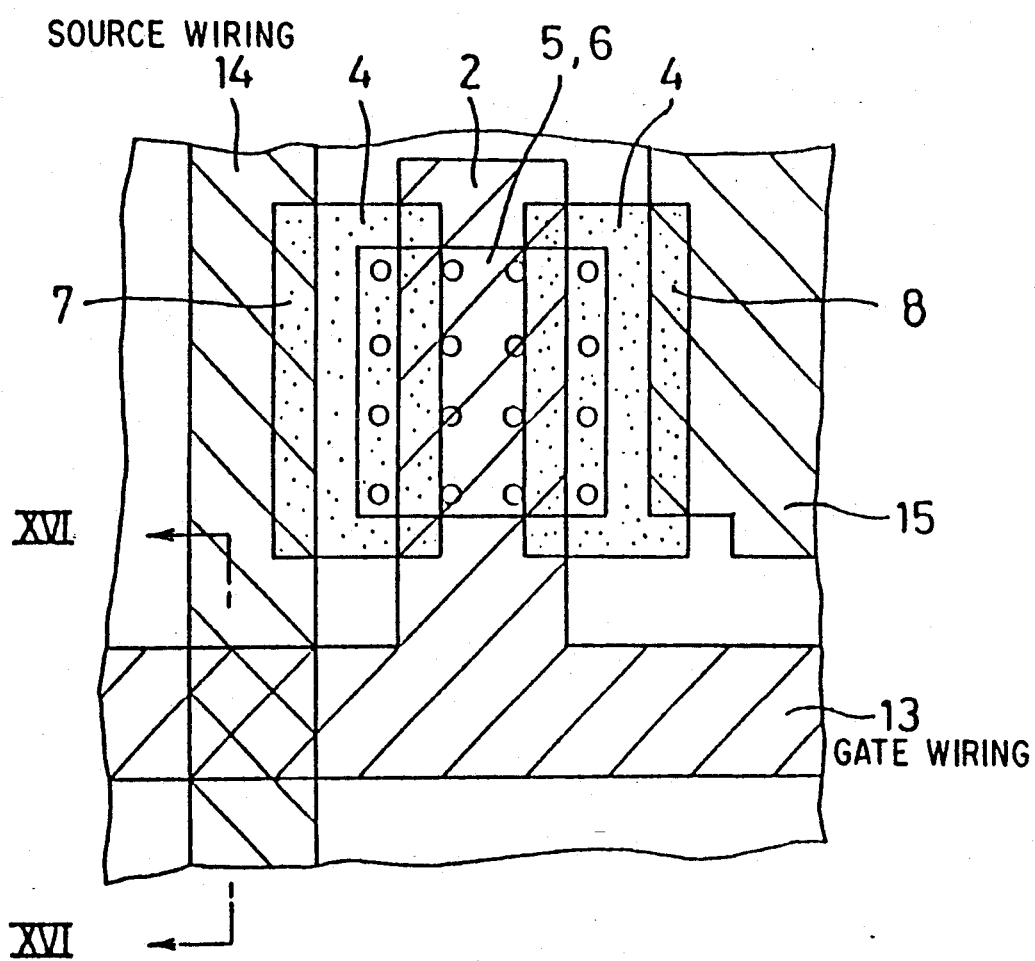
FIG. 15 is a plan diagram showing a tenth embodiment of the present invention.
Figure 16:
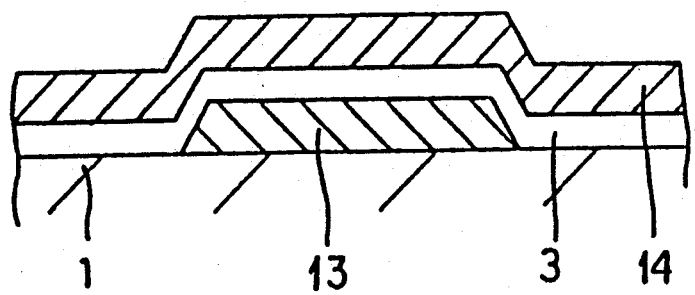
FIG. 16 is a cross-sectional diagram taken along line XVI—XVI of FIG. 15.

Referring now to FIGS. 15 and 16, application of the silicon thin film transistor of the present invention to an active matrix type liquid crystal display device will now be described.

In the present embodiment, a gate wiring 13 is formed at the same time as the formation of gate electrode 2, and a source wiring 14 and picture element electrode 15 are formed at the same time as the formation of source electrode 7 and drain electrode 8. Therefore, the formation can be carried out without increasing fundamentally the number of mask sheets.

Cr or the like can be used for gate electrode 2 and gate wiring 13, and ITO or the like for source electrode 7, drain electrode 8, source wiring 14, and picture element electrode 15.

Embodiment 11

Figure 17:
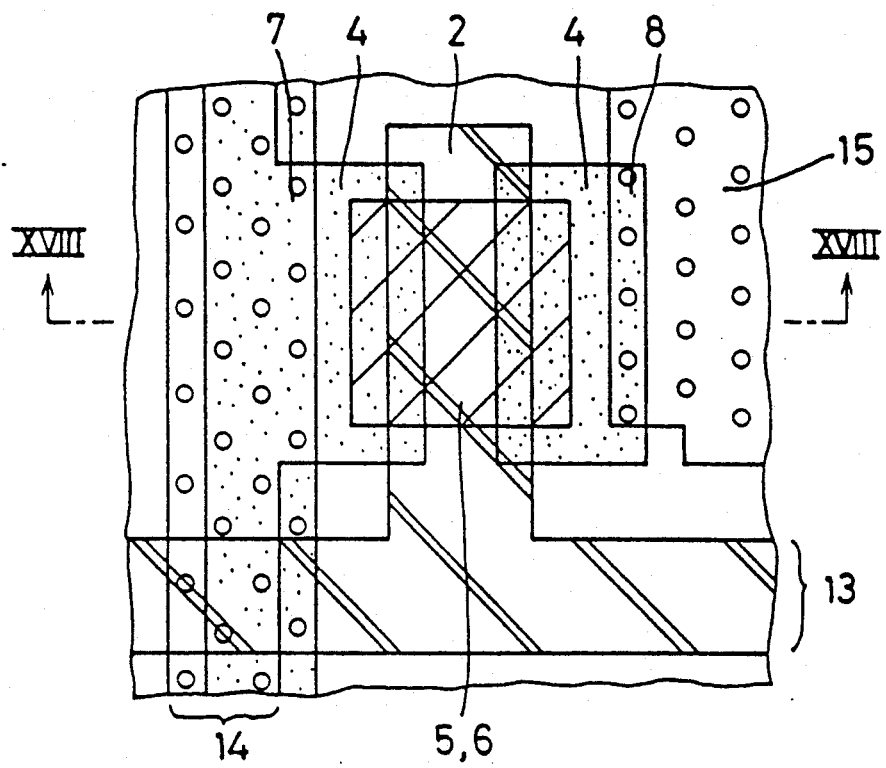
FIG. 17 is a plan diagram showing an eleventh embodiment of the present invention.
Figure 18:
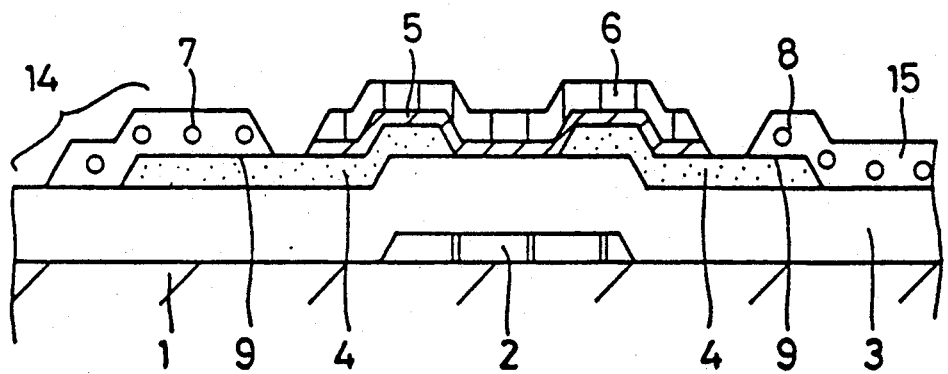
FIG. 18 is a cross-sectional diagram taken along line XVIII—XVIII of FIG. 17.

Referring now to FIGS. 17 and 18, there is shown an eleventh embodiment of the present invention. Specifically, the present embodiment provides first impurity contained silicon layer 4 in parallel to source wiring 14, and as to all other aspects, it is the same as those in the tenth embodiment.

Embodiment 12

Figure 19:
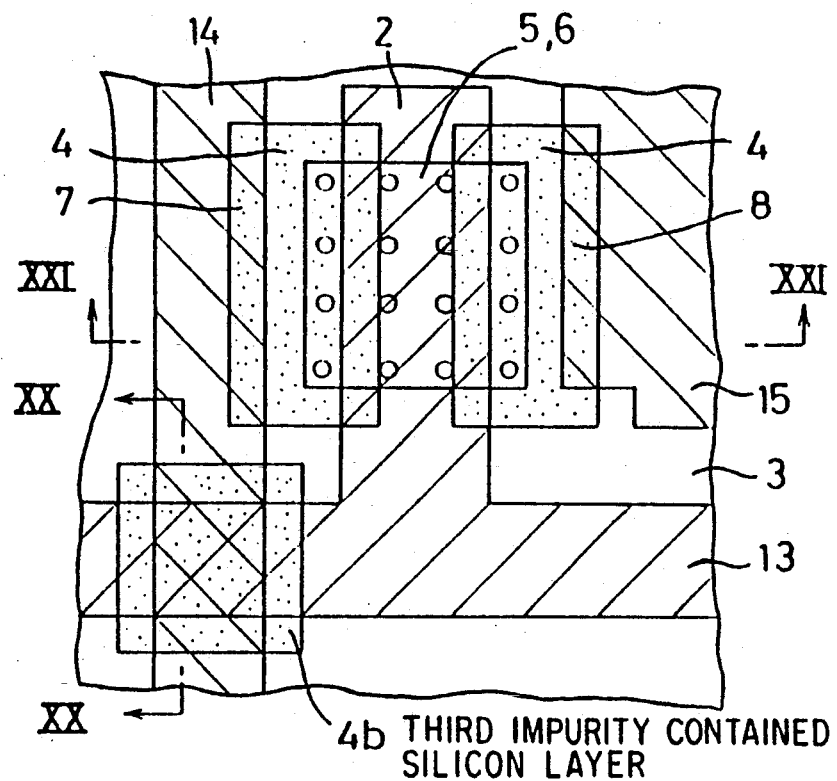
FIG. 19 is a plan diagram showing a twelfth embodiment of the present invention.
Figure 20:
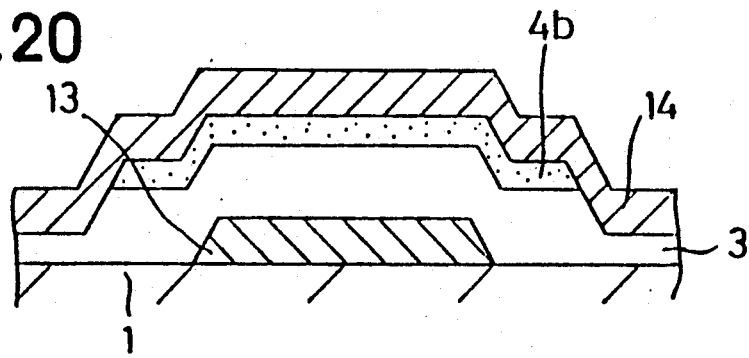
FIG. 20 is a cross-sectional diagram taken along line XX—XX of FIG. 19.
Figure 21:
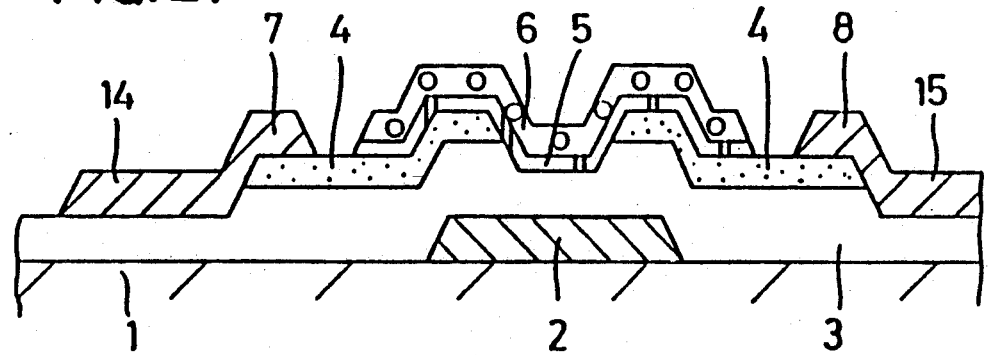
FIG. 21 is a cross-sectional diagram taken along line XXI—XXI of FIG. 19.

Referring now to FIGS. 19, 20, and 21, there is shown a twelfth embodiment of the present invention. The present embodiment is also directed to the application of the silicon thin film transistor of the present invention to an active matrix type liquid crystal display device.

As will first be described with respect to the above-described tenth embodiment, there are various problems.

In the production procedure of FIG. 2(b) in the first embodiment, it is necessary to clean the exposed surface of first impurity contained silicon layer 4 by use of a diluted fluoric acid aqueous solution. At this time, gate insulating layer 3 is also etched. Moreover, since silicon nitride and silicon oxide used in gate insulating layer 3 are readily etched by the diluted fluoric acid aqueous solution, the film thickness of gate insulating layer 3 becomes considerably thin due to the etching. Therefore, in the tenth embodiment, poor insulation is apt to occur between gate wiring 13 and source wiring 14 at the crossing part of gate wiring 13 with source wiring 14.

Therefore, in the present embodiment, as shown in FIGS. 1 and 20, a third impurity contained silicon layer 4b is provided to make it difficult for malinsulation to occur. Third impurity contained silicon layer 4b is formed at the same time as first impurity contained silicon layer 4, and is formed in such a manner as to cover gate insulating layer 3 positioned at the crossing part of gate wiring 13 with source wiring 14. Due to such an arrangement, gate insulating layer 3 covered with third impurity contained silicon layer 4b is not etched at the time of cleaning the exposed surface of first impurity contained silicon layer 4 by use of diluted fluoric acid aqueous solution, so that the film thickness thereof does not become thin, as shown in FIG. 20.

Embodiment 13

Figure 22:
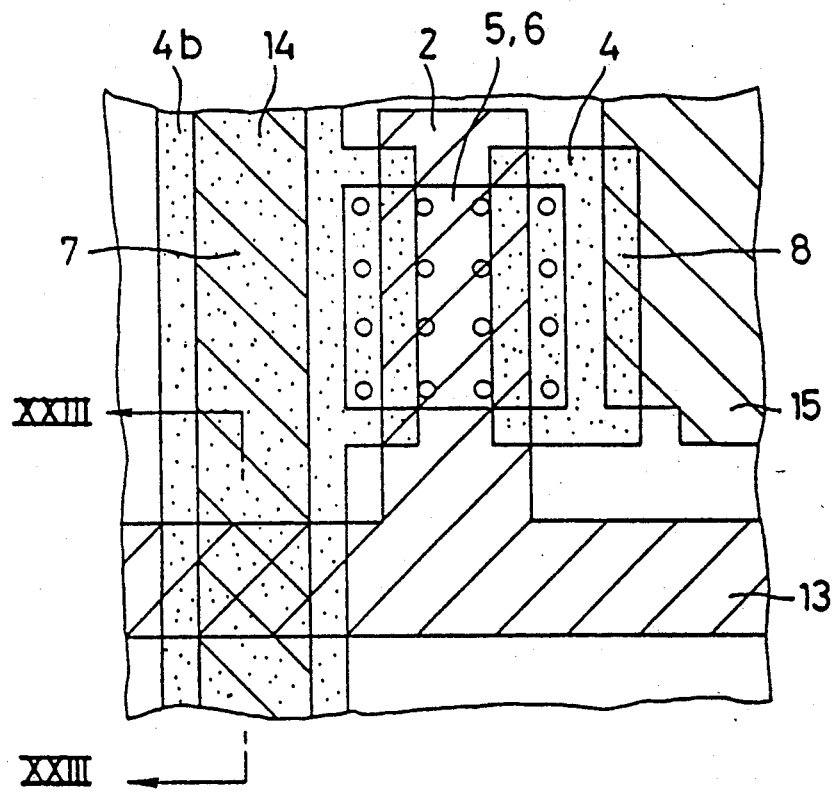
FIG. 22 is a plan diagram showing a thirteenth embodiment of the present invention.
Figure 23:
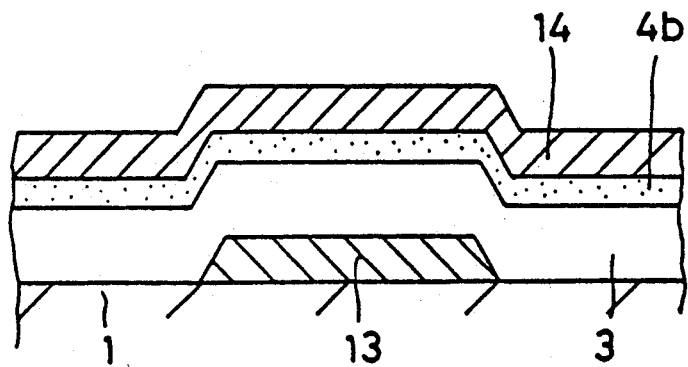
FIG. 23 is a cross-sectional diagram taken along line XXIII—XXIII of FIG. 22.

Referring now to FIGS. 22 and 23, there is shown a thirteenth embodiment of the present invention.

In the present embodiment, third impurity contained silicon layer 4b is formed along approximately the whole region defined by the boundary of source wiring 14 and is of a wider width than that of source wiring 14, so that the same effect as that achieved in the twelfth embodiment can be obtained.

In the twelfth embodiment, as shown in FIG. 20, source wiring 14 is required to transversely cross the step difference between third impurity contained silicon layer 4b and gate insulating layer 3 generated by etching of the diluted fluoric acid solution. Accordingly, wire breaking of source wiring 14 is apt to occur at this step difference.

In the present embodiment, as shown in FIG. 23, among the above-described step differences, since the step difference of gate insulating layer 3 generated by etching with diluted fluoric acid solution is absent, wire breaking of source wiring 14 at this step difference can be reduced.

Furthermore, in the present embodiment, since third impurity contained silicon layer 4b absorbs light, and light leakage is reduced, the contrast of the display is improved when the present embodiment is used in an active matrix type liquid crystal display device.

Embodiment 14

Figure 24:
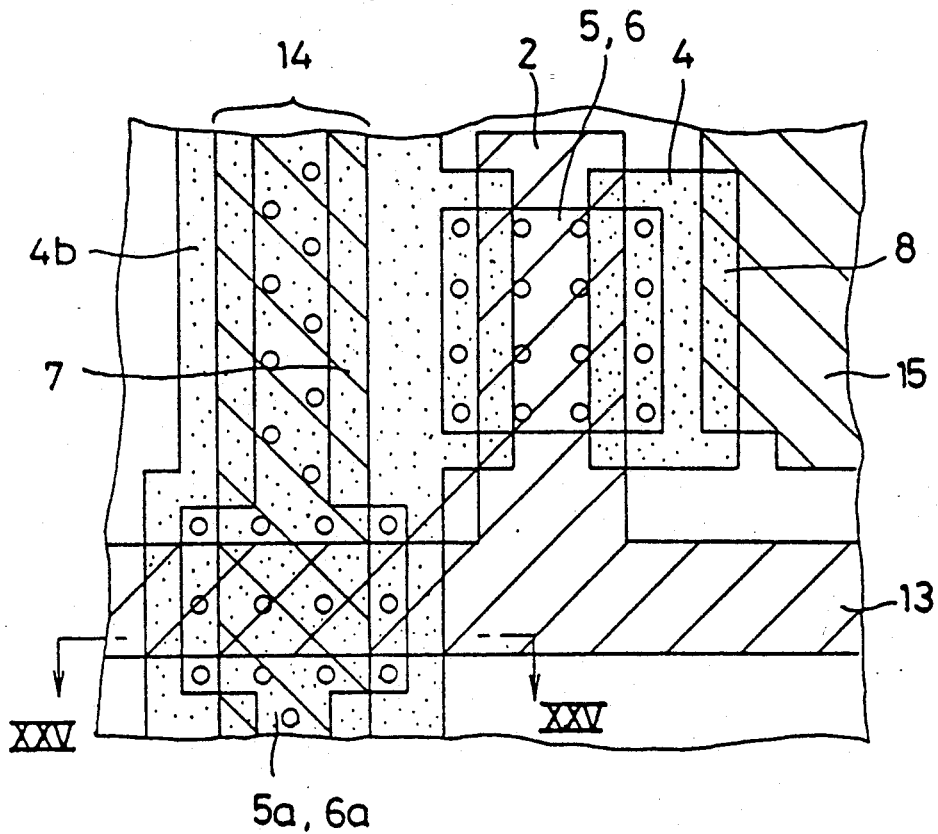
FIG. 24 is a plan diagram showing a fourteenth embodiment of the present invention.
Figure 25:
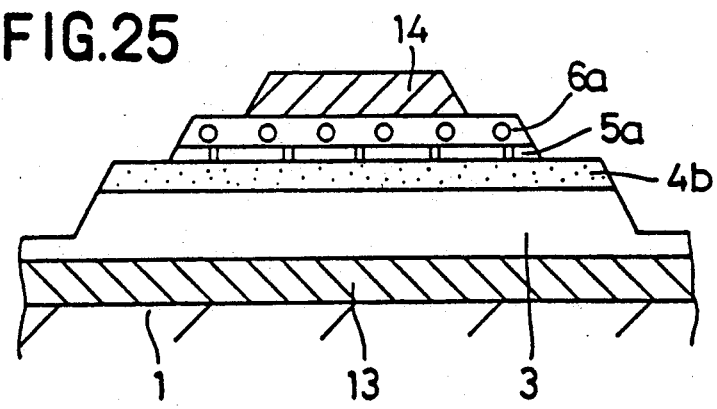
FIG. 25 is a cross-sectional diagram taken along line XXV—XXV of FIG. 24.
Figure 26:
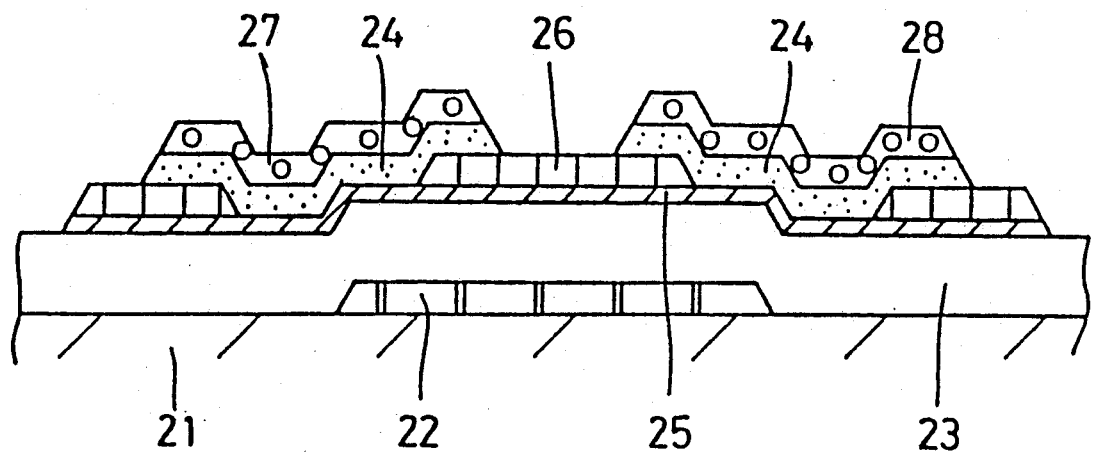
FIG. 26 is a cross-sectional diagram of a conventional silicon thin film transistor.

Referring now to FIGS. 24 and 25, there is shown a fourteenth embodiment of the present invention.

In the present embodiment, third impurity contained silicon layer 4b is formed on gate insulating layer 3 over almost the whole range defined by the boundary of source wiring 14 and is of a wider width than that of source wiring 14. Moreover, the pattern of intrinsic silicon layer 5a and protective insulating layer 6a is formed on third impurity contained silicon layer 4b in such a manner as to cover the crossing part of gate wiring 13 and source wiring 14, and the same effect as that achieved in the thirteenth embodiment can be obtained.

Furthermore, in the present embodiment, since intrinsic silicon layer 5a and protective insulating layer 6a are formed separately from gate insulating layer 3 and third impurity contained silicon layer 4b at the crossing part of gate wiring 13 with source wiring 14, poor insulation characteristics between gate wiring 13 and source wiring 14 can be reduced to a large extent.

Intrinsic silicon layer 5a and protective insulating layer 6a will be effective at the same time as the formation of intrinsic silicon layer 5 and protective insulating layer 6.

In the above-described embodiments 1–14, it is preferable to use silicon nitride, silicon oxide, or a multilayered film of silicon nitride and silicon oxide for gate insulating layer 3. Although the use of an amorphous silicon layer is desirable for each impurity contained silicon layer and intrinsic silicon layer, a polycrystalline silicon or the like can also be used. For protective insulating layer 6, silicon nitride, silicon oxide, or the like can be used.

According to the present invention, the junction state of impurity contained silicon layer 4 and intrinsic silicon layer 5 can be improved, and good transistor characteristics can be obtained In addition, the following effects can be obtained.

In the embodiments in which intrinsic silicon layer 5 is formed inside of the boundary defined by gate electrode 2, off-current at the time of light irradiation can be decreased to a large extent.

In the embodiments in which the contact part 9 is formed at the outside of the boundary defined by gate electrode 2, since the overlap capacity can be reduced, the response properties of the transistor can be enhanced.

In the embodiments in which the terminal part of intrinsic silicon layer 5 is positioned at the outside of the boundary define by gate electrode 2 and inside of the boundary defined by impurity contained silicon layer 4, off-current at the time of light irradiation can be reduced to a large extent.

In the embodiments in which the counterposing edges of the pair of impurity contained silicon layers 4 under intrinsic silicon layer 5 are formed with comb teeth, the parasite resistance is reduced and lowering of the on-current of the transistor can be prevented.

In the production method in which the photoresist on protective insulating layer 6 is exposed from the back surface of insulating substrate 1, and the pattern of intrinsic silicon layer 5 and protective insulating layer 6 is formed by the pattern of the photoresist obtained by developing this photoresist, the number of mask sheets can be decreased, and cost reduction and improvement of the yield can be obtained.

In the embodiments in which second impurity contained silicon layer 4a containing impurities of the type reverse to the impurities in first impurity contained silicon layer 4 of silicon is provided, since second impurity contained silicon layer 4a and protective insulating layer 6 are continuously formed, a clean interface can be obtained.

Also, in the embodiments in which the silicon thin film transistors of the present invention are provided in an array-like arrangement, an excellent silicon thin film transistor array having the respective features can be obtained.

In the embodiments in which, in the silicon thin film transistor array, third impurity contained silicon layer 4b has been formed in such a manner as to cover gate insulating layer 3 positioned at the crossing part of gate wiring 13 with source wiring 14, it is difficult to form poor insulating characteristics at this crossing part.

Further, in such silicon thin film transistor array in which third impurity contained silicon layer 4b has been formed over approximately the whole region defined by the boundary of source wiring 14, with a wider width than that of source wiring 14, malinsulation between gate wiring 13 and source wiring 14 can be reduced to a large extent.

What we claim is:

1. A silicon thin film transistor comprising:
   an insulating substrate;
   a gate electrode formed on the insulating substrate;
   a gate insulating layer formed on said insulating substrate containing said gate electrode;
   a pair of first impurity contained silicon layers formed on said gate insulating layer in such a manner as to transversely cross a terminal part of said gate electrode, whereby said impurity layers have first surfaces facing toward said gate insulating layer and second surfaces facing away from said gate insulating layers;
   an intrinsic silicon layer formed directly on said second surfaces of said pair of first impurity contained silicon layers and on said gate insulating layer between said pair of first impurity contained silicon layers in such a manner as to connect said pair of first impurity contained silicon layers;
   a protective insulating layer formed on said intrinsic silicon layer in the same shape as that of said intrinsic silicon layer; and
   a source electrode and a drain electrode formed at contact parts of said pair of first impurity contained silicon layers,
   wherein the intrinsic silicon layer connecting said pair of first impurity contained silicon layers is formed within a boundary defined by said gate electrode.

* * * * *